United States Patent [19]

Sanders et al.

[11] Patent Number: 5,053,309

[45] Date of Patent: * Oct. 1, 1991

[54] COLOR IMAGE-FORMING PROCESS

[75] Inventors: Frederick W. Sanders; Gary F. Hillenbrand; Jonathan S. Arney; Richard F. Wright, all of Chillicothe, Ohio

[73] Assignee: The Mead Corporation, Dayton, Ohio

[ * ] Notice: The portion of the term of this patent subsequent to Aug. 16, 2000 has been disclaimed.

[21] Appl. No.: 501,393

[22] Filed: Mar. 22, 1990

Related U.S. Application Data

[63] Continuation of Ser. No. 323,702, Mar. 15, 1989, abandoned, which is a continuation of Ser. No. 339,917, Jan. 18, 1982, Pat. No. 4,842,976.

[51] Int. Cl.$^5$ .......................... G03C 1/72; G03F 7/027
[52] U.S. Cl. .................................... 430/138; 430/365; 430/333; 430/211; 430/235; 282/27 R
[58] Field of Search ............... 430/138, 365, 333, 211, 430/235; 282/27.5

[56] References Cited

U.S. PATENT DOCUMENTS

| | | | |
|---|---|---|---|
| 4,149,887 | 4/1979 | Levy | 427/144 X |
| 4,399,209 | 8/1983 | Sanders et al. | 430/138 |
| 4,440,846 | 4/1984 | Sanders et al. | 430/211 X |
| 4,842,976 | 6/1989 | Sanders et al. | 430/138 |

FOREIGN PATENT DOCUMENTS

| | | |
|---|---|---|
| 52-34488 | 9/1977 | Japan . |
| 53-9519 | 1/1978 | Japan . |
| 1141475 | 1/1969 | United Kingdom . |

Primary Examiner—Cynthia Hamilton
Attorney, Agent, or Firm—Thompson, Hine and Flory

[57] ABSTRACT

A color image forming process wherein images are formed by reaction of cyan, magenta and yellow color precursors with a developer material, the reaction is image-wise controlled by image-wise exposure of a photosensitive composition encapsulated in pressure rupturable capsules, image-wise exposure of the photosensitive composition and rupture of the capsules releases the color precursor for patterned reaction with the developer material.

2 Claims, 3 Drawing Sheets

COLOR IMAGE-FORMING PROCESS

This is a continuation of co-pending application Ser. No. 323,702 filed Mar. 15, 1989, now abandoned, which, in turn, is a continuation of Ser. No. 339,917, now U.S. Pat. No. 4,842,976.

BACKGROUND OF THE INVENTION

The present invention relates to a color image-forming process, and more particularly, to a process which employs a photosensitive encapsulate and a color precursor to form color images by an exposure-controlled pattern-wise reaction between the color precursor and a developer material.

Imaging systems based on photosensitive encapsulates are known. Berman, U.S. Pat. No. 3,219,446 discloses a transfer imaging process in which azo-blue-"B" black dye is encapsulated with a cross-linkable polymer or a polymerizable monomer as a fluid-droplet containing film or a fluid droplet containing microcapsules. As described, the Berman imaging system is a transfer system which relies upon selectively transferring the encapsulated dye to a copy sheet in correspondence with the image. Imaging is accomplished by image-wise exposing a layer of the encapsulate to electromagnetic radiation to cross-link the polymer, causing the liquid in the exposed capsules to assume a rigid condition and not transfer to a copy sheet. Dye transfer is limited to the unexposed areas of the encapsulate-containing layer.

Phillips, U.S. Pat. No. 3,700,439 discloses a photocopy process wherein Michler's ketone is encapsulated in a conventional manner and provided as a layer on a support. Michler's ketone itself is not a color former, but patterned irradiation of the ketone containing capsules produces a latent image of colorless, acid-colorable, dye precursor from the ketone such that upon contact with an acid developer such as acid clay a visible image is obtained. Phillips discloses both a system wherein the exposed imaging sheet is calendered face-to-face with an acid-coated receiving sheet to form images and a system wherein the acid developer is on the same surface as the capsule coating so that after rupturing the capsules on the imaging sheet there is development without transfer.

Berman et al, U.S. Pat. No. 3,072,481 discloses another type of encapsulated light sensitive element which utilizes a light-sensitive material which is readily converted to a colored form when carried in a liquid vehicle but which is insensitive to light when solid. By encapsulating such a material with a volatile solvent, image-wise exposing a layer of the encapsulate and rupturing the capsules to evaporate the solvent, an image is obtained and fixed.

Forris, U.S. Pat. No. 3,001,873, discloses a more complex system wherein the walls of capsules containing a solid dye are photosensitized such that patterned exposure renders the capsules unswellable. By wetting the sheet to swell the unexposed capsules and heating, the dye is immobilized in the unexposed areas. Thereafter, by rupturing the capsules in contact with a receiving sheet there is an image-wise transfer of the dye from the exposed areas only.

Varden, Modern Photography, "What's Ahead?", p. 86 (1958) proposes a system based on gelatin microcapsules where instead of simply gelatin, the capsules are formed from a gelatin silver halide emulsion. According to the author these capsules could contain cyan, magenta and yellow color precursors and be sensitized and used to form color images. The article proposes exposing the sensitized gelatin capsules and hardening them by tanning development (a silver catalyzed process) to prevent the capsules from releasing their contents in the areas of exposure whereby there is a differential release of the capsule contents according to the exposure. There is no evidence in the article indicating that such a system was ever successfully reduced to practice but the fact that the system depends on photographic silver in the capsule wall and would require a wet development step to harden the capsule walls makes it unattractive for many applications.

SUMMARY OF THE INVENTION

A principal object of the present invention is to provide a process for forming color images utilizing an imaging system in which images are formed by reaction of a color precursor and a developer, wherein the reaction of the color precursor and developer is controlled by exposure of a photosensitive composition encapsulated in pressure rupturable capsules.

In accordance with one embodiment of the invention, cyan, magenta and yellow color precursors are carried on separate imaging sheets in combination with an encapsulated photosensitive composition and images are formed by image-wise transferring the precursors to an image-receiving developer sheet. Typically, the composition is an ultraviolet radiation curable composition sensitive to ultraviolet radiation. To expose this composition a color image is resolved into its red, green and blue components which are respectively translated to ultraviolet radiation. Using an ultraviolet image corresponding to each of the red, green and blue components of the original, each of the cyan, magenta and yellow color precursor bearing imaging sheets is exposed. Exposure immobilizes or renders non-transferable the color precursors in the exposed areas thereby preventing them from reacting with the developer material which is carried on a separate image-receiving developer sheet and producing color. This inactivation of the color precursors may be achieved by simply entraining the color precursors in the cured/polymerized photosensitive composition or by tieing up a solvent required to dissolve the color precursors in the photosensitive composition or by other mechanisms.

Following exposure, at least the capsules in the unexposed areas of the imaging sheets are ruptured. Typically, capsule rupture is conducted in contact with a sheet carrying a developer material such as what is commonly referred to as an electron accepting compound by passing the exposed imaging sheet in face to face contact with the active surface of the developer sheet through a pressure nip. This results in transfer of the color precursor to the developer sheet where it reacts to form a color image. By sequentially, rupturing the capsules of the exposed cyan, magenta and yellow color precursor-bearing sheets and passing them through a pressure nip in contact with a single developer sheet, a full color image is obtained.

In accordance with another embodiment of the invention, the cyan, magenta and yellow precursors are carried on a single imaging sheet where they are each associated with encapsulated photosensitive compositions sensitive to different wavelengths in the ultraviolet region. In accordance with this embodiment, a color image is resolved into its red, green, and blue component images each of which is respectively translated into the ultraviolet radiation wavelength to which the photosensitive encapsulate associated with the complimentary color precursor is sensitive. The imaging sheet is exposed to the ultraviolet radiations derived from each of the red, green and blue components of the original. A full color image is obtained in a single transfer by passing the exposed sheet in face-to-face contact with the active surface of a developer sheet. Alternatively, so called "self-contained" techniques can be used in conjunction with this embodiment of the invention according to which the developer material is co-deposited on the imaging sheet with the color precursors, for example, as a separate layer underlying the layer containing the color precursors and the photosensitive encapsulate. In a self-contained sheet, the color images are formed by simply rupturing the capsules in the unexposed areas thereby rendering the color precursors accessible to the developer for full color image formation. In this embodiment of the invention, the color precursors may be encapsulated in the pressure rupturable capsules with the photosensitive composition or fixed in the capsule wall, as opposed to using techniques in which the color precursor is otherwise less directly associated with the photosensitive encapsulate. The reason for this is that with all three color precursors on one imaging sheet, it is essential that each color precursor be unaffected by exposure of the photosensitive compositions associated with the other color precursors. Furthermore, the cyan, magenta and yellow color precursors and their associated photosensitive encapsulates must be uniformly distributed across the sheet.

In still another embodiment of the invention, the imaging sheet possesses visible light sensitivity. In accordance with this embodiment, photosensitive compositions are selected and encapsulated so as to achieve sensitivity in each of the red, green and blue wavelength regions. These compositions are then associated with cyan, magenta and yellow color precursors, respectively. This image-forming system can be embodied in either a transfer or self-contained imaging sheet as in the case of the previous embodiment. Using this imaging technique, color resolution is unnecessary. The imaging sheet can be exposed by simply focusing an image of the original onto the imaging sheet followed by capsule rupture, and in the case of a transfer sheet, transfer for image development.

While in two of the above embodiments of the invention, the invention has been described as translating the red, green and blue components of an original into ultraviolet radiation, it should be apparent to those skilled in the art that the translation may be to any radiation which is actinic for the encapsulated photosensitive compositions. Hence, in the case of the first embodiment, wherein cyan, magenta, and yellow color forming sheets are separately exposed the exposure radiation may be ultraviolet, infrared, the entire visible spectrum, as well as X-ray and ion beam radiation. In the second embodiment discussed above, the exposure radiation is preferably one for which the sensitivity wavelength differences can be established among the encapsulates associated with each color precursor.

Thus, the present invention, in one case provides an imaging process employing an imaging sheet comprising a support and a coating composition adhered to one surface of the support, the coating composition including a cyan, magenta or yellow color precursor and a radiation curable photosensitive composition wherein at least the photosensitive composition is encapsulated in pressure rupturable capsules, including the steps of:
  a) resolving a multi-color image into its red, green and blue images,
  b) translating individually, each of the red, green and blue component images into a radiation which is actinic for the radiation curable photosensitive composition,
  c) image-wise exposing the imaging sheet to the actinic radiation translated from one of the red, green and blue component images to form exposed and unexposed areas in the imaging sheet whereby the color precursor is image-wise immobilized in the exposed areas,
  d) rupturing the capsules in at least the unexposed areas, and
  e) transferring the precursor from the unexposed areas to an image-receiving developer sheet comprising a support coated on one surface with a material capable of reacting with the color precursors and providing a color image so as to form a color positive image.

The aforesaid process is repeated using a second and third imaging sheet in which the color precursor is, respectively, the other of the color precursors not present in the other imaging sheets. By sequentially transferring the color precursors which remain mobile after image-wise exposure to a single developer sheet, a full color image is obtained.

Where the color precursors are associated with photosensitive encapsulates having distinct sensitivities and are carried on a single imaging sheet, the aforementioned process comprises
  (a) resolving a multicolor image into its red, green and blue component images,
  (b) translating the red, green and blue component images to radiations which are actinic with respect to the radiation curable photosensitive compositions associated with the complimentary color precursors
  (c) image-wise exposing the sheet sequentially or simultaneously to the actinic radiations translated from said red, green and blue images, so as to image-wise immobilized the cyan, magenta and yellow color precursors, and
  (d) rupturing at least the capsules not exposed by the actinic radiation in the presence of a developer material to form a color image.

The aforementioned process may be a transfer process in which case the developer is carried on a separate developer sheet or a self-contained process in which case the imaging sheet carries the developer material co-deposited with the color precursor and photosensitive encapsulate.

Where the cyan, magenta and yellow color precursors are associated with photosensitive encapsulates sensitive, respectively, to the red, green and blue visible wavelength regions, the process described above reduces to image-wise exposure and capsule rupture in the presence of the developer material. Because the capsules are light-sensitive, it is unnecessary to resort to color resolution and translation to an actinic radiation.

In addition to the aforesaid processes for color image formation, the present invention also provides a color imaging sheet wherein that sheet comprises cyan, magenta and yellow color precursor associated with photosensitive encapsulates having distinct radiation sensitivities. In accordance with one embodiment, the cyan, magenta and yellow color precursors are associated, respectively, with photosensitive encapsulates sensitive in different wavelength, regions within the ultraviolet spectrum or another actinic region. In a further embodiment of the invention, the color imaging sheet bears cyan, magenta and yellow precursors associated with light-sensitive encapsulates sensitive in each of the red, blue and green regions. The former sheet is used in imaging processes wherein there is a translation from visible light to a radiation actinic with respect to the photosensitive encapsulates associated with each color precursor. The latter color imaging sheet is useful in visible light imaging.

DETAILED DESCRIPTION OF THE INVENTION

Figure 1:
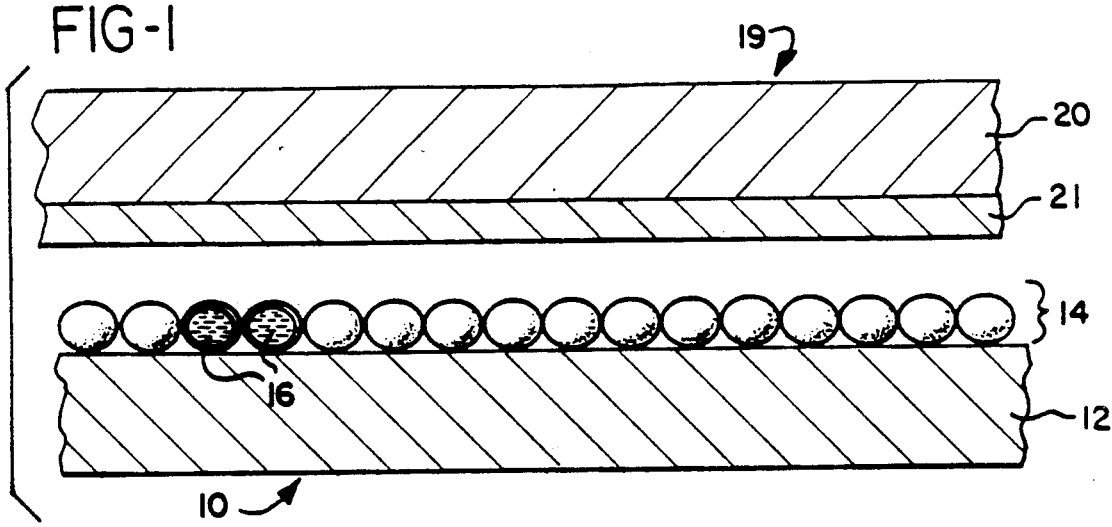
FIG. 1 is a schematic illustration in cross-section of a transfer imaging sheet and associated developer sheet used in one embodiment the present invention.

FIG. 1 illustrates the transfer imaging system used in the present invention. Therein imaging sheet 10 is shown comprising a substrate 12 coated with a layer of microcapsules 14. The microcapsules are filled with an internal phase 16 which, for purposes of illustration is considered as containing a color precursor and a photosensitive composition. In actuality, the microcapsules 14 are not visible to the unaided eye. Associated with the imaging sheet 10 is a developer sheet 19 comprising a substrate 20 and a layer 21 of developer material thereon.

Figure 2:
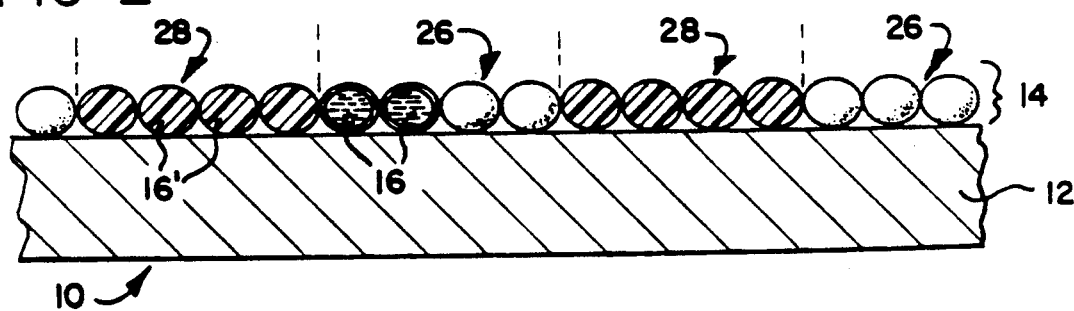
FIG. 2 is a schematic illustration of an exposed imaging sheet used in the invention.

An exposed imaging sheet is shown in FIG. 2 wherein the layer of microcapsules 14 is shown with unexposed areas 26 and exposed areas 28. In exposed areas 28, the exposure radiation cures the photosensitive composition in the internal phase 16 causing it to polymerize, gel, solidify or otherwise increase in viscosity and immobilize the color precursor. For simplicity in the exposed area 28 the internal phase 16' is shown as solid resin. On the other hand, in the unexposed areas 26, the internal phase is unaffected and is shown as remaining liquid and the color precursor is not immobilized.

Figure 3:
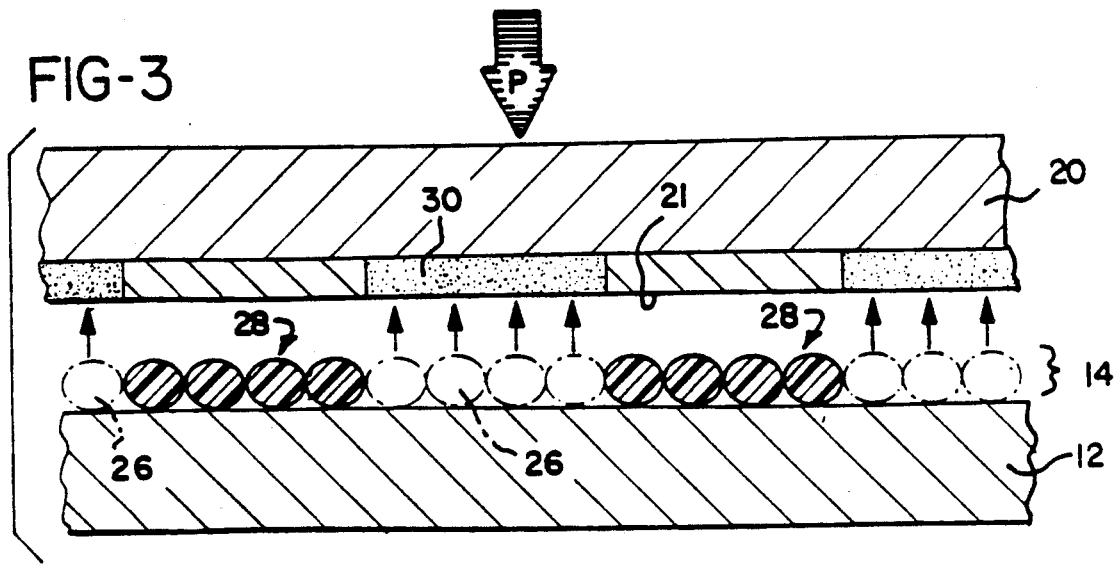
FIG. 3 is a schematic illustration of transfer development.

Image formation and development is shown in FIG. 3 where the now exposed imaging sheet 10 becomes a transfer sheet and is placed with its microcapsule layer 14 in face-to-face contact with the developer material 21 of developer sheet 19 and a pressure P is uniformly applied across the surface of the sheets. The pressure is shown as rupturing the microcapsules in the unexposed areas 26 and not rupturing the capsules in the exposed areas 28. This is in accordance with one theory of operation which holds that in the exposed areas, the internal phase is hardened to such an extent that the microcapsules can no longer be ruptured. There is, however, another theory which holds that all the capsules are ruptured but that the color precursor is immobilized by the increased viscosity which results in the internal phase 16' in the exposed areas 28 upon exposure. In actuality, all or a portion of the capsules may also be ruptured in the exposed areas 28.

Typically, the capsules are ruptured by passing the imaging sheet 10 and the developer sheet 19 together through a pressure nip. This causes the internal phase 16 from the unexposed areas 26 to transfer to the developer sheet 19 as shown schematically by the arrows in FIG. 3. Upon transfer of the internal phase 16 to the developer sheet 19, the color precursor reacts with the developer material layer 21 and forms an image 30 on the developer sheet. It should be apparent that while the radiation curable material provides a positive working imaging sheet, in that the exposed areas are nontransferable and the unexposed areas are transferable, the transferred image 30 is reversed (right-left) compared to the latent image in the imaging sheet 10. Thus, in reflected light imaging, optics must be relied upon to reverse the exposed image so as to produce a true image on transfer.

Although not illustrated, self-contained imaging systems are also useful in the present invention. In these systems, instead of a developer sheet, the developer material is contained on the imaging sheet either interdispersed among the microcapsules in the layer 14 or as a separate layer underlying the microcapsule layer. In a self-contained imaging system, it is unnecessary to transfer the color precursor, but rather upon rupturing the capsules in the unexposed areas, the color precursor can migrate to the developer where it reacts in combination with the precursors associated with other capsules to form a color image.

Herein, the term "encapsule" refers to both so-called resin dispersion or open phase systems in which the photosensitive composition is dispersed as droplets throughout a dispersing medium and systems in which the photosensitive composition is encapsulated in a discrete capsular wall, the later encapsulation typically being in the form of micro-capsules. "Pressure-rupturable capsules", therefore, exists in either of these "encapsulated systems".

In accordance with the present invention, images are formed by exposing the coated capsular composition to an actinic radiation and rupturing the capsules to liberate the color precursor in the presence of a developer The invention system is designed such that when these steps are carried out, the image-forming reaction between the color precursor and the developer discriminately occurs in the unexposed area. Where the color precursors are contained on a single imaging sheet, the image forming reactions are limited to those color precursors which are associated with capsules not exposed by radiation within their sensitivity range. In this manner, the cyan, magenta and yellow precursors selectively react with the developer in their respective unexposed regions to compositely form a full color image.

Typically, images are formed by encapsulating the color precursor with the photosensitive composition. Upon exposure, the photosensitive composition cures (the term "cure" includes polymerization as well as cross-linking) and entrains the color precursor thereby preventing it from reacting with the developer and forming a color image. It is also sufficient to incorporate the color precursor in the wall of a discrete wall type capsule and rely upon the release of a solvent for the precursor or some cleavage reactant to free the precursor from the capsule wall. Where the radiation curable photosensitive contains a low molecular weight monomer, the monomer may function as a solvent for the precursor in the unexposed areas. In this case, exposure of the radiation curable composition cures, gels or otherwise solidifies it in the exposed areas, and, upon capsule rupture (if capsule rupture occurs in the exposed areas) the color precursor remains and entrained in the capsular wall. In the unexposed areas, however, where the photosensitive composition remains liquid, the composition itself or a solvent encapsulated with the composition dissolves the color precursor and carries it out of the capsule wall to the developer for image formation. While the foregoing discussion refers to the color precursor, generally, it will be apparent to those skilled in the art that these reactions take place for each of the cyan, magenta and yellow color precursors upon the exposure of the associated photosensitive encapsulate by actinic radiation within its sensitivity range.

The present invention does not require a given capsule to completely release or completely retain its encapsulate upon exposure, as long as there is a difference in the amount of precursor transferring or migrating to the developer and thereby reacting with it in the unexposed versus the exposed areas. Indeed, the invention provides superior tonal quality and one theory for the tonal quality of the images obtained is that the amount of color precursor released from a given capsule depends on the degree of exposure of the encapsulate in that particulate capsule. Furthermore, it is also not clear whether the amount of color precursor transferred, is determined by differential capsule rupture (image versus non-image areas) in the invention. Under one theory all of the capsules (in both image and non-image areas) are uniformly ruptured and they transfer color precursor in proportion to the viscosity of the internal phase in that area or at the point of the image. Under another theory, the tonal range of the images are formed by a matrix of ruptured and unruptured capsules. In actuality, a combination of both theories may occur. Regardless of the theory, upon rupture of the capsules, there is patterned release and immobilization of the color precursor according to the exposure, which it has been found corresponds to the degree of exposure such that tonal gradation is obtained.

Figure 4:
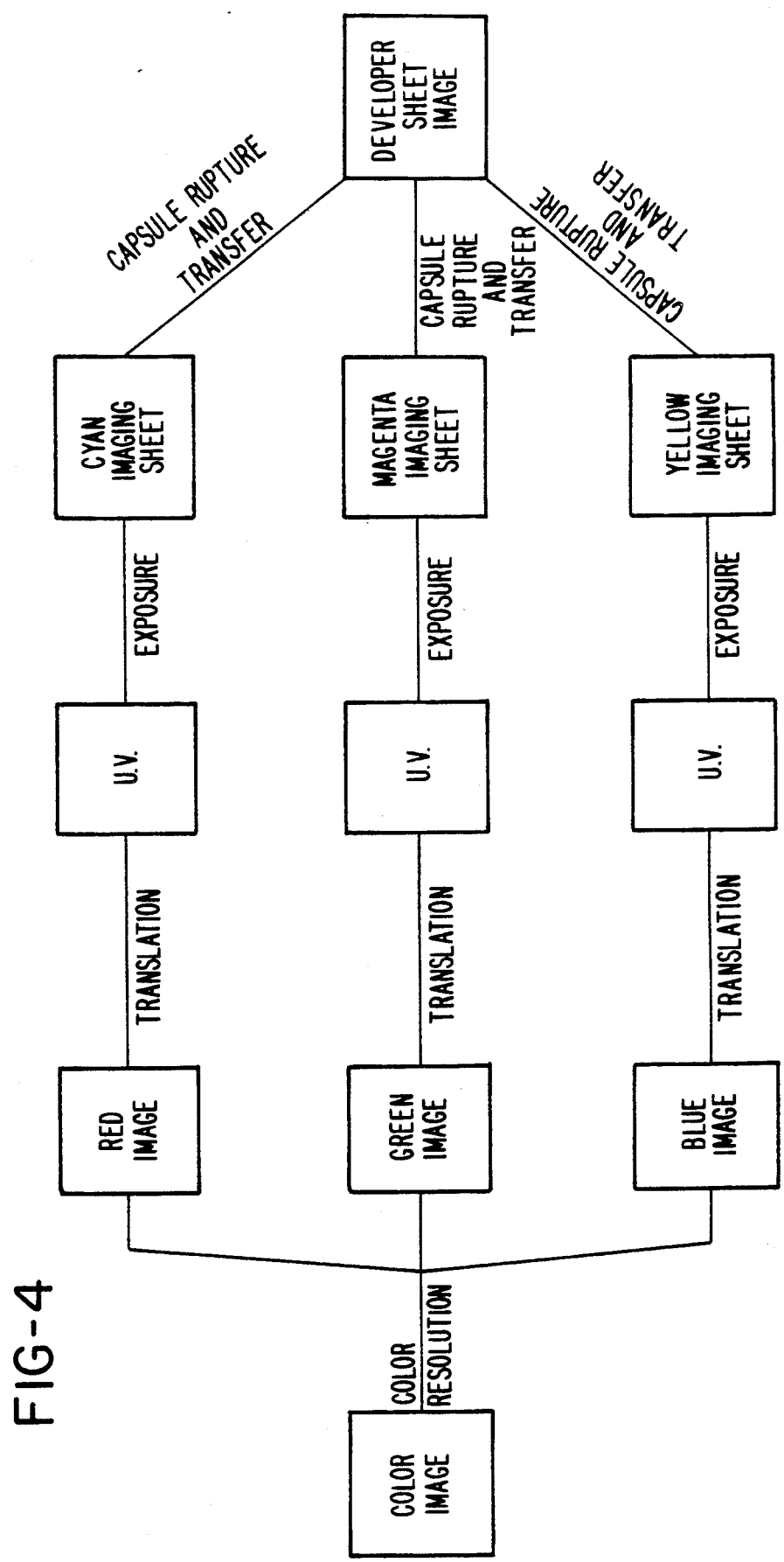
FIG. 4 is a diagram of one color image-forming process in accordance with the invention.
Figure 5:
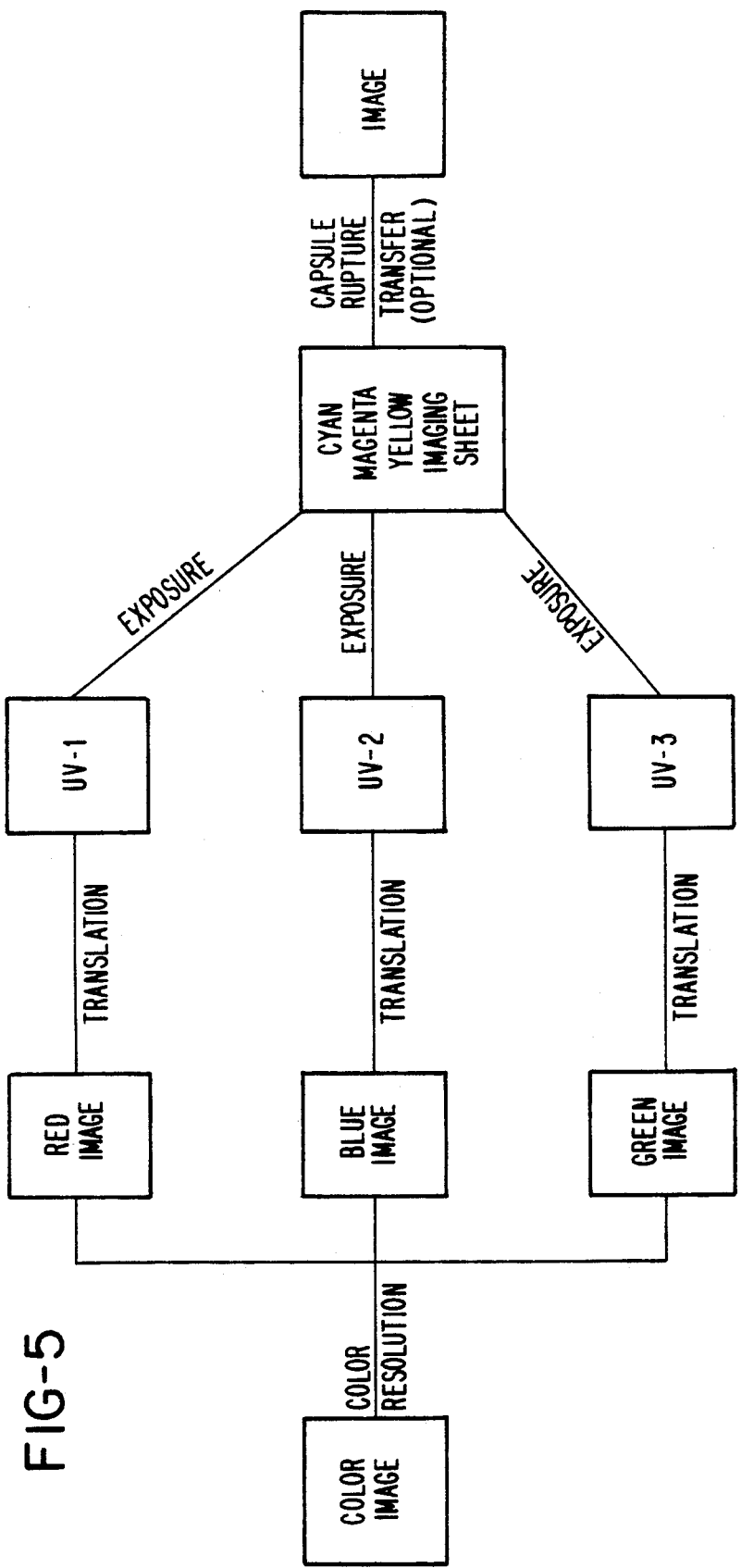
FIG. 5 is a diagram of another color image-forming process in accordance with the invention.
Figure 6:
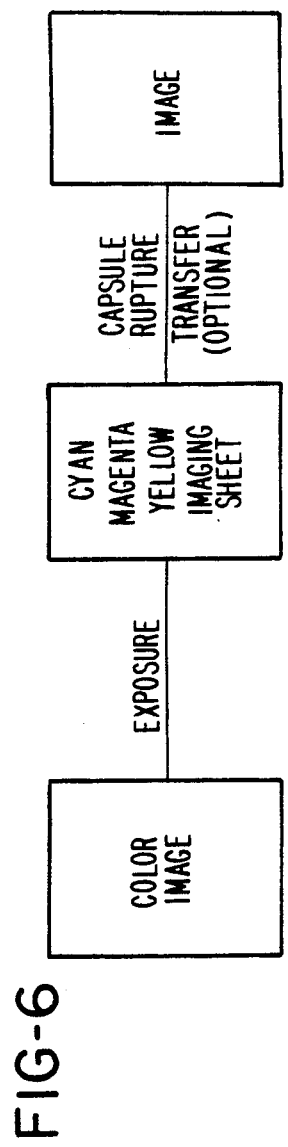
FIG. 6 is a diagram of still another image-forming process.

With this background, imaging in accordance with the present invention will now be explained by reference to FIGS. 4, 5 and 6. FIGS. 4, 5 and 6 are block diagrams illustrating three embodiments of the imaging process of the invention. As shown in FIG. 4, a color original is resolved into its red, green, and blue component images, each of which is translated into ultraviolet radiation for exposure of three separate imaging sheets each bearing the cyan, magenta and yellow precursors, respectively. Because three imaging sheets are used and they are separately exposed, the red, green, and blue component images can be translated into the same ultraviolet radiation. There is no requirement for a different sensitivities in the photosensitive encapsulates associated with each of the cyan, magenta and yellow color precursors in this embodiment. Full color image formation in accordance with the embodiment illustrated in FIG. 4 can only be accomplished by transfer processing. Thus, each of the exposed cyan, magenta and yellow imaging sheets is passed through a pressure nip in face-to-face registered contact with a developer sheet to form the full color image.

FIG. 5 illustrates another embodiment of the invention in which the cyan, magenta and yellow color precursors are preferably embodied on a single imaging sheet. In accordance with this embodiment, the original is resolved into its red, green and blue component images which, respectively, are translated into ultraviolet radiation of different wavelengths (UV-1, UV-2 and UV-3). Each of the cyan, magenta and yellow color precursors is associated with a photosensitive encapsulate sensitive, respectively, to the ultraviolet radiation wavelength derived from its complimentary red, green or blue image. The imaging sheet may be exposed simultaneously to the different wavelength radiations derived from the component images. The exposed sheet is developed by rupturing the capsules in at least the unexposed areas in the presence of a developer. Where the imaging sheet is a self-contained sheet containing the developer, the image is formed directly on the imaging sheet. On the other hand, where the developer is carried on a separate sheet, imaging is by transfer imaging as in the case of the FIG. 4 embodiment.

FIG. 6 illustrates the embodiment where the cyan, magenta and yellow color precursors are associated with photosensitive encapsulates sensitive respectively in the red, green and blue wavelength regions. In accordance with this embodiment, no color resolution is required, the imaging sheet is light-sensitive and may be exposed directly. Image formation occurs as in FIGS. 4 and 5 by rupturing the microcapsules in at least the unexposed areas associated with each color precursor in the presence of a developer.

While the foregoing embodiments of the present invention have been explained with reference to translating the red, green and blue images into ultraviolet radiation, those skilled in the art will appreciate that the red, green and blue images may be translated into any radiation which is actinic radiation for the photosensitive compositions associated with the color precursors, including the full spectra of electromagnetic radiation including ultraviolet, infrared, the entire visible spectrum, as well as X-ray and ion beam. Thus, in the case of FIG. 4, the red, green and blue images may be translated to ion beam radiation. The embodiment illustrated in FIG. 5, however, requires that sensitivity distinction be established in the actinic radiations derived from the red, green and blue images. While three wavelengths of ultraviolet radiation have been used to illustrate this embodiment, naturally any three radiations to which the associated photosensitive compositions are discriminately sensitive may be used.

The means used in the present invention to translate the red, green and blue images into actinic radiation does not form a part of the present invention. Any of the conventional means for electronically processing a visible image may be used for this purpose including a Dunn camera or a matrix camera. Generally, conventional means for accomplishing this translation include color filters to resolve the original into its component images, photoreceptors for sensing the respective component images, means for scanning those photoreceptors and generating an electrical output and imaging tubes for converting the output to an appropriate radiation wavelength.

In the most typical case, the photosensitive composition used in the present invention comprises a radiation curable material. The radiation curable materials used in the present invention are preferably materials curable by free radical initiated chain propagated, addition polymerization or ionic polymerization but substantially any photopolymerizable composition which can be encapsulated and which does not interfere with the image-forming capability of the color precursor can be used. These materials may be inherently sensitive to the actinic radiation, in which case they may be hardened without a photoinitiator but usually they are materials which are curable in the presence of a photoinitiator. Furthermore, while in the most typical case, the radiation-curable materials are monomers which undergo an increase in viscosity as a result of polymerization, they may also be oligomers, prepolymers, or polymers which undergo cross-linking upon exposure. In addition to free radical polymerizable materials they may also be materials which are polymerized or cross-linked ionically, e.g., by generation of a Lewis acid.

Representative radiation curable materials are ethylenically unsaturated organic compounds. These compounds contain at least one terminal ethylenic group per molecule. Typically they are liquid and can also double as a carrier oil for the color precursor in the internal phase.

A preferred group of radiation curable materials is ethylenically unsaturated compounds having two or more terminal ethylenic groups per molecule. Representative examples of these compounds include ethylenically unsaturated acid esters of polyhydric alcohols such as trimethylol propane triacrylate.

Another preferred radiation curable substance is an acrylate prepolymer derived from the partial reaction of pentaerythritol with acrylic acid or acrylic acid esters. Radiation curable compositions based on such prepolymers having an acrylate functionality of between approximately two and three are available commercially in two-package system radiation curable compositions from the Richardson Company, Melrose Park, Ill., such as RL-1482 and RL-1483 which are recommended to be mixed together to form a radiation curable clear varnish in a ratio of 4.4 parts of RL-1482 to 1 part RL-1483.

Isocyanate modified acrylate, methacrylic and itaconic acid esters of polyhydric alcohols as disclosed in U.S. Pat. Nos. 3,783,151; 3,759,809 and 3,825,479 all to Carlick et al which are specifically incorporated by reference, are also useful. Radiation curable compositions based on these isocyanate modified esters and including reactive diluents such as tetraethylene glycol diacrylate as well as photoinitiators such as chlorinated resins, chlorinated paraffins and amine photoinitiation synergists are commercially available as overprint varnishes from Sun Chemical Corporation, Carlstat, N.J., under the trade name of Suncure resins.

Another class of curable materials useful in the present invention are found in radiation curable inks as the photosensitive component such as a mixture of pentaerythritol acrylate and a hologenated aromatic, alicyclic or aliphatic photoinitiator as disclosed in U.S. Pat. No. 3,661,614 to Bessemir et al, which is also incorporated by reference.

Where the color precursor is encapsulated with the photosensitive composition the radiation curable material must be present within the pressure rupturable capsule in an amount sufficient to immobilize the color precursor upon exposure. Typically these materials constitute 40 to 99 wt % of the internal phase (based on the weight of the oil solution containing the precursor, the photosensitive composition and the carrier oil when present). In some embodiments, it has been found desirable to dilute the photosensitive composition with a carrier oil to improve half-tone gradation. In these cases a carrier oil is present in the amounts disclosed below and the radiation curable material makes up to 40 wt % of the internal phase.

Those skilled in the art will appreciate that various photoinitiators can be selected for use in the present invention depending on the sensitivity that is required in the encapsulate. These compounds absorb the exposure radiation and generate a free radical alone or in conjunction with a sensitizer. They may be homolytic photoinitiators which cleave to form two radicals and initiators which radiation converts to an active species which generates a radical by abstracting a hydrogen from a hydrogen donor. They may also be initiators which complex with a sensitizer to produce a free radical generating species and initiators which otherwise generate radicals in the presence of a sensitizer. If the system relies upon ionic polymerization to tie up the chromogen, the initiator may be the anion or cation generating type depending on the nature of the polymerization. For example, the initiators used in the present invention may be a diaryl ketone derivatives, or benzoin ethers. Where ultraviolet sensitivity is desired, suitable photoinitiators include α alkoxy phenyl ketones, O-acylated αα oximinoketones, polycylic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, haloalkanes, α-haloaphenylacetophenones; photoreducible dye-reducing agent redox couples, halogenated paraffins (e.g., brominated or chlorinated paraffins) and benzoin alkyl ethers. In addition, benzophenone per esters are useful in the invention.

The following compounds may be useful as photoinitiators in the present invention: α-alkoxyphenyl ketones of the formula I

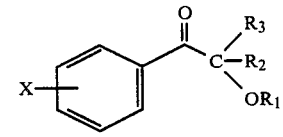

where R' is a Cl-4 alkyl group (e.g., methyl, ethyl, n-propyl, i-propyl, t-butyl, etc.), $R^2$ is a phenyl group or a substituted phenyl group wherein said substituent is as defined for X below, $R^3$ is hydrogen or a Cl-4 alkyl group, and X is hydrogen, an alkoxy group having 1 to 4 carbon atoms (e.g., methoxy, ethoxy, propyloxy, etc.), a dialkylamino group wherein said alkyl group contains 1 to 4 carbon atoms, a nitro group, a nitroso group, a cyano group, a mercapto group, chlorine, bromine or iodine, an alkyl group having 1 to 4 carbon atoms, an alkenyl group having 1 to 4 carbon atoms, an acyl group, a phenyl group, or a carboalkoxy group having 2 to 5 carbon atoms;

an α,α, dialkoxyphenyl ketone of the formula II

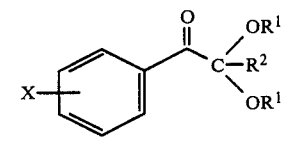

wherein $R^1$, $R^2$ and X are defined as in formula I;
1-phenyl-1,2-propanedione-2-O-benzoyloxime, 9,10-phenanthraquinone,
9,10-anthraquinone,
a benzophenone of the formula III

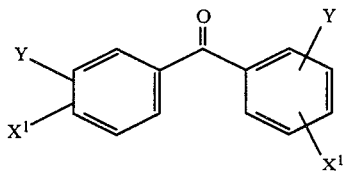

where X' is hydrogen, an amino group, or a dialkylamino group, the alkyl group having 1 to 4 carbon atoms, and Y is hydrogen, an alkyl group having 1 to 4 carbon atoms, an alkoxy group having 1 to 4 carbon atoms, an alkenyl group having 1 to 4 carbon atoms, a phenyl group, a substituted phenyl group, a dialkylamino group, a nitro group, a nitroso group, a cyano group, a mercapto group, chlorine, bromine, iodine, or an acyl group;

xanthone, a chloroxanthone, a chloromethyl xanthone, a chlorosulfonyl xanthone,
thioxanthone, a chlorothioxanthone, a chloromethyl thioxanthone, a chlorosulfonyl thioxanthone,
chloromethylnaphthalene,
chlorosulfonyl naphthalene,
chloromethyl anthracene,
chlorosulfonyl anthracene,
chloromethyl benzoxazole,
chloromethyl benzothiazole,
chloromethyl benzimidazole,
chlorosulfonyl benzoxazole,
chlorosulfonyl benzothiazole,
chlorosulfonyl benzimidazole,
a chloromethyl quinoline,
a chlorosulfonyl quinoline,
a chloromethyl benzophenone,
a chlorosulfonyl benzophenone,
a chloromethyl fluorenone,
a chlorosulfony fluorenone,
carbon tetrabromide,
benzoin methyl ether,
benzoin ethyl ether,
desyl chloride,
desyl amine,
methylene blue/ascorbic acid,
chlorinated aliphatic hydrocarbons and combinations thereof.

Benzo per esters useful in the invention are disclosed in Lamburtis et al, *J. Org. Chem.* 1979, 44 No. 23, pp. 4123–4128 and Gupta et al, *J.Polym. Sci. Polym. Chem.* 1981 19 No. 43, pp. 855–868.

For ultraviolet sensitivity one useful photoinitiator-sensitizer is a combination of Michler's ketone and benzoin methyl ether (preferred ratio 2:5).

In accordance with one embodiment of the present invention, microcapsules containing the cyan, magenta and yellow precursors are sensitive to three different bands of ultra-violet radiation. This is possible by selecting a photoinitiator and radiation curable material combination which is photosensitive within a predetermined and limited wavelength range. Employing one such composition in each of the cyan, magenta and yellow color precursor-containing microcapsules gives a set of microcapsules which can be employed on a single support and produce color images upon exposure with radiations in each range corresponding to the red, green and blue color components of an image.

Red, green and blue light sensitivity can be obtained by using appropriate sensitizers in combination with the photosensitive compositions described above or by incorporating filter dyes in the capsule wall of a light-sensitive encapsulate.

The photoinitiator is present in the internal phase in an amount sufficient to initiate polymerization or crosslinking within a short exposure time. Using benzoin methyl ether as an example, this photoinitiator is typically present in an amount of up to 10% based on an amount of radiation curable material in the internal phase. Naturally, the amount varies depending on the nature of the other components of the photosensitive composition. Those skilled in the art can readily determine amounts suitable for the desired exposure properties. Exposure times may range from up to 1 minute but are preferably on the order of one to several seconds or less. The actual exposure time will also depend on a number of variables such as coat weight, coat thickness, the radiation curable substance (rate of photopolymerization), the type and source of radiation, the radiation intensity and its distance from the sheet. Furthermore, exposure can be expedited with a minimum amount of heating.

It is also possible to reduce the exposure time by incorporating a scattering agent in the capsule layer. A scattering agent increases the means free path and thereby intensifies exposure. One such scattering agent that can be used in the present invention is magnesium dioxide.

The color precursors used in the present invention are preferably oil soluble color formers which will produce a color upon reaction with a developer material in the presence of a carrier oil. Substantially any of the precursors conventionally used in carbonless paper can be used in the present invention, In general, these materials are colorless electron donating type compounds. Representative examples of such color formers include substantially colorless compounds having in their partial skeleton a lactone, a lactam, a sultone, a spiropyran, an ester or an amido structure. Specifically, there are triarylmethane compounds, bisphenylmethane compounds, xanthene compounds, thiazine compounds, spiropyran compounds and the like. Mixtures of the respective color precursors can be used if desired.

Some representative leuco dye color precursors which give yellow, cyan and magenta images are shown below:

Yellow color precursors:

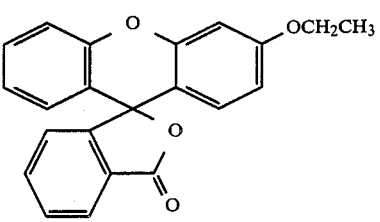

-continued

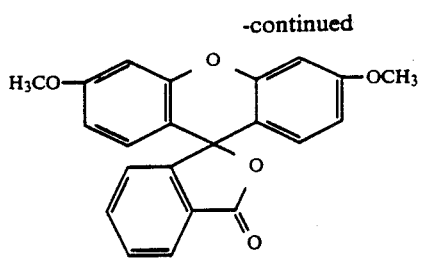

Cyan color precursors:

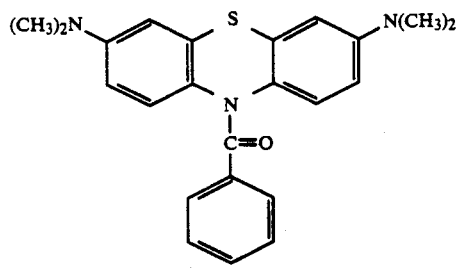

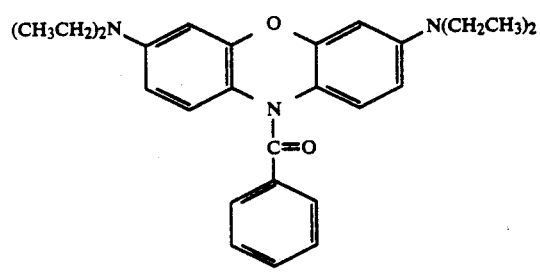

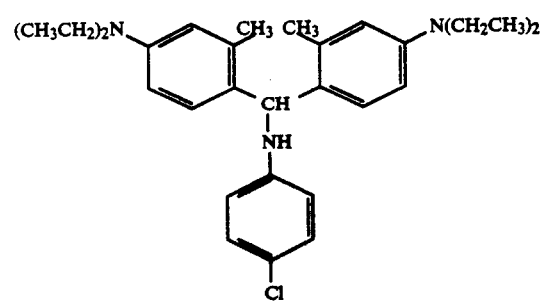

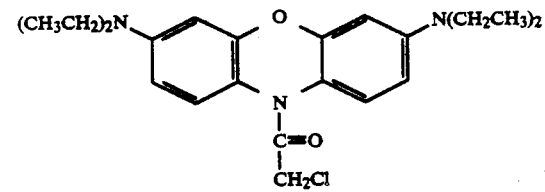

Magenta color precurosors:

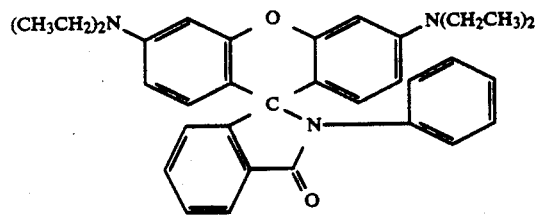

-continued

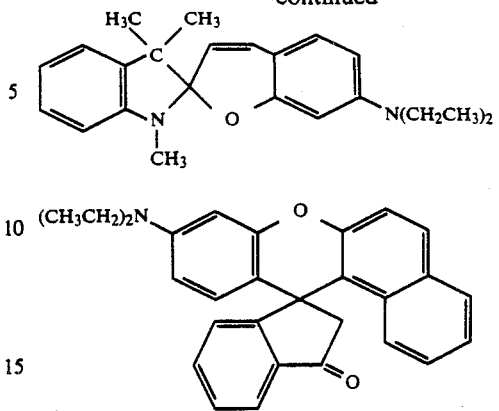

The color precursors used in the present invention must be non-absorbing with respect to the exposure radiations relied upon to cure the photosensitive encapsulate since the color precursors are either present in the encapsulate or the exposure radiation must pass through the color precursor to expose the encapsulate such as when the color precursor is present in the capsule wall. Hence, colorless electron donating type compounds are preferred for use in the present invention. This is particular the case where imaging is preformed using a self-contained imaging sheet since the unreacted color precursor remains on the sheet where it would detract from the quality of the image were it not substantially colorless. Of course, a completely colorless color precursor is difficult to obtain and a small degree of coloration may be tolerated in the color precursor as long as it does not interfere with exposure.

The encapsulate of the present invention may also include a carrier oil. Preferred carrier oils are weakly polar solvents having boiling points above 170° C. and preferably in the range of 180° C. to 300° C. The carrier oils used in the present invention are typically those conventionally used in carbonless paper manufacture. These oils are generally characterized by their ability to dissolve Crystal Violet Lactone in a concentration of 0.5 wt % or more. However, a carrier oil is not always necessary. Whether a carrier oil should be used will depend on the solubility of the color precursor in the photosensitive composition after exposure, the nature of the color precursor and the viscosity of the characteristics of the internal phase. When present, examples of carrier oils are alkylated biphenyls (e.g., monoisopropylbiphenyl), polychlorinated biphenyls, castor oil, mineral oil, deodorized kerosene, naphthenic mineral oils, dibutyl phthalate, dibutyl fumerate, brominated paraffins and mixtures thereof. Alkylated biphenyls are generally less toxic and preferred. The presence of a carrier oil affects and can be used to control the tonal quality of the images obtained. Initial studies show that where trimethylol propane triacrylate is used in the radiation curable material, 20% of a carrier oil such as brominated paraffin improves tonal qualities.

In accordance with the invention, the color precursor is incorporated in the internal phase in an amount sufficient to produce a visible image of the desired density upon reaction with the developer. In general, these amounts range from approximately 0.5 to about 20.0 percent based on the weight of the internal phase solution (e.g., monomer or monomer and oil) containing the chromogen and must be adjusted for each precursor and encapsulate to achieve color balance. A preferred range is from about 2 percent to about 7 percent. The amount of the color precursor required to obtain suitable images depends on the nature of the chromogen, the nature of the internal phase, and the type of imaging system. Typically less color precursor is used in the internal phase of a self-contained imaging system in comparison to a transfer system. This is because the developer material is co-deposited on a common substrate with the chromogenic encapsulate and there is a tendency for the color precursor to diffuse through the capsule wall and react with the developer material during storage and because there is no inherent loss in transfer. One means of preventing undesired coloration in a self-contained sheet is to reduce the amount of the color precursor in the internal phase. Another means is to incorporate color suppressants with the color precursor.

The imaging systems of the present invention may be formulated such that they are sensitive to any of ultraviolet, infrared, X-ray, ion beam, and visible radiation. Ultraviolet sensitive imaging systems are suitable for recording images from a cathode ray tube. This can provide a particularly suitable means for translating the red, green, and blue component images to an actinic form. That is, an original can be electronically scanned, output signals corresponding to each of the red, green and blue images can be obtained and displayed on a CRT which is used to expose sequentially a cyan, magenta and yellow imaging sheet.

An encapsulate as described above can be encapsulated in a conventional manner. Oil soluble color precursors have been encapsulated in hydrophilic wall-forming materials such as gelatin wall-forming materials (see U.S. Pat. Nos. 2,730,456 and 2,800,457 to Green et al) including gum arabic, polyvinyl alcohol, carboxymethyl-cellulose; resorcinol-formaldehyde wall-formers (see U.S. Pat. No. 3,755,190 to Hart et al), isocyanate wall-formers (see U.S. Pat. No. 3,914,511 to Vassiliades) isocyanate-polyol wall-formers (see U.S. Pat. No. 3,796,669 to Kiritani et al) urea formaldehyde wall-formers and a particularly urea-resorcinol-formaldhyde wall formers in which oleophilicity is enhanced by the addition of resorcinol (see U.S. Pat. Nos. 4,001,140; 4,087,376 and 4,089,802 to Foris et al) melamine-formaldehyde resin and hydroxypropyl cellulose (see commonly assigned U.S. Pat. No. 4,025,455 to Shackle). To the extent necessary for complete disclosure of those wall-forming materials, the above mentioned patents are specifically incorporated by reference. Microencapsulation has been accomplished by a variety of known techniques including coacervation, interfacial polymerization, polymerization of one or more monomers in an oil, as well as various melting, dispersing and cooling methods.

The capsule forming material used in a given imaging system is selected based on the photosensitive composition present in the encapsulate. Thus, the capsule forming material must be transparent to the exposure radiation. Of the above systems urea-resorcinol-formaldehyde and gelatin capsules are preferred.

The mean size of the capsules used in the present invention generally ranges from approximately 1 to 25 microns. As a general rule, image resolution improves as the capsule size decreases with the caveat that if the capsule size is too small, depending on the nature of the substrate on which the capsules are coated, the capsules may disappear in the pores or the fiber in the substrate, but even capsules as large as 25 microns provide satisfactory resolution in the present invention. In the latter case, the incongruities in the substrate may screen the capsules from exposure and thereby diminish image quality. They may also fail to rupture upon the application of pressure. In view of the foregoing, it has been found that a preferred mean capsule size range is approximately 3 to 15 microns and particularly approximately 3 to 10 microns although, technically, the capsules can range in size up to the point that they are visible to the human eye.

Capsular coating compositions are prepared in a conventional manner in accordance with the present invention. Since the photosensitive encapsulate of the present invention is usually hydrophobic, the wall-forming constituents and the film forming binder should be hydrophilic and soluble in an aqueous based liquid as is conventional in forming capsule containing coating compositions. Otherwise, in certain known reverse systems, the aqueous phase may be dispersed in a hydrophobic continuous phase. The microcapsules used in the present invention can be prepared by the methods disclosed in the aforementioned U.S. patents or by similar methods. For example, an oil solution of the internal phase comprising the color precursor and the photosensitive composition is dispersed in a continuous phase containing the wall-forming constituents, and microencapsulation is accomplished by, for example, coacervation or interfacial polymerization, among others. Open phase systems can be prepared by dispersing the internal phase in a solution of polymeric binder and adjusting the viscosity of the dispersion for coating. Suitable binders are gelatin, polyvinyl alcohol, polyacrylamide, acrylic latices, etc.

The coating compositions of this invention may contain any of the various additives known in the carbonless paper art to improve the handling characteristics of the coated copy sheet such as a stilt material (e.g., starch particles), silica particles to prevent specking when a pressure nip is used for capsule rupture, etc.

The substrate upon which the coating composition is typically coated is paper. The paper may be a commercial impact raw stock, or a special grade paper such as cast-coated paper and chrome rolled paper. The latter examples are desirable when using very fine microcapsules, e.g., capsules ranging in size from approximately 1 to 5 microns, as the surface of these papers is smoother and the microcapsules are not as easily embedded in the stock fibers. Transparent substrates such as polyethylene terephthalate and translucent substrates can also be used in the invention and have the advantage that the latent image formed in the imaging sheets need not be reversed for printing.

The developer material used in the present invention is a compound or material capable of reacting with the color precursor to produce a color image. In the most typical case, the developer material is an electron accepting compound or a so-called color developer.

The developer materials used in the present invention are those conventionally employed in carbonless paper technology and are well known. Illustrative specific examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert butyl salicylate, oil soluble metal salts of phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120) etc. and mixtures thereof. Again, to the extent necessary for complete disclosure of these developer materials, the above noted patents are specifically incorporated by reference.

When used in a developer sheet, the color developer may be mixed with a binder such as latex, polyvinyl alcohol, maleic anhydride-styrene copolymer, starch and gum arabic. It is to be understood that all binders well known as film-forming materials can be used in this capacity.

Having described the invention in detail and by reference to the specific embodiments thereof, it will be apparent that numerous variations and modifications are possible without departing from the scope of the invention defined by the following claims.

What is claimed is:

1. A color imaging system comprising an imaging sheet and dry developer material carried on a separate image receiving sheet, said imaging sheet having on one surface of a polyethylene terephthalate support a coating comprising a cyan color precursor,
a radiation curable photosensitive composition encapsulated with said cyan color precursor,
a magenta color precursor,
a radiation curable photosensitive composition encapsulated with said magenta color precursor,
a yellow color precursor, and
a radiation curable photosensitive composition encapsulated with said yellow color precursor,
said radiation curable photosensitive compositions having distinct sensitivities and being encapsulated in pressure rupturable capsules as an internal phase,
said capsules having discrete capsule walls,
said cyan, magenta and yellow color precursors being oil-soluble, and
said imaging system being capable of forming images by image-wise exposing said imaging sheet to radiation actinic with respect to said photosensitive compositions, and rupturing at least said capsules containing photosensitive compositions unexposed by said actinic radiation in the presence of said developer material to form an image by reaction of said color precursors with said developer material.

2. The color imaging system of claim 1 wherein said developer material is a zinc modified oil soluble phenol-formaldehyde resin.

* * * * *

UNITED STATES PATENT AND TRADEMARK OFFICE
CERTIFICATE OF CORRECTION

PATENT NO. : 5,053,309
DATED : October 1, 1991
INVENTOR(S) : Frederick W. Sanders It is certified that error appears in the above-indentified patent and that said Letters Patent is hereby corrected as shown below:

On the title page, item [75] should read as follows:
--Frederick W. Sanders, Chillicothe, Ohio--

Signed and Sealed this

Twelfth Day of July, 1994

Attest:

BRUCE LEHMAN

*Attesting Officer*  *Commissioner of Patents and Trademarks*